United States Patent [19]
Henegar
[11] 3,769,606
[45] Oct. 30, 1973

[54] DIGITALLY CONTROLLED FREQUENCY FILTER

[75] Inventor: Harold H. Henegar, Manassas, Va.
[73] Assignee: The Singer Company, New York, N.Y.

[22] Filed: May 26, 1971
[21] Appl. No.: 147,021

[52] U.S. Cl. .......... 330/66, 330/21, 330/51, 307/241
[51] Int. Cl. .......... H03f 3/04
[58] Field of Search .......... 330/51, 21, 66; 307/241; 328/150

[56] References Cited

UNITED STATES PATENTS

| | | | |
|---|---|---|---|
| 2,679,554 | 5/1954 | Hurford | 330/51 X |
| 3,466,564 | 9/1969 | Weischedel | 330/66 |
| 3,493,669 | 2/1970 | Elbrecht et al. | 84/1.16 |
| 2,855,508 | 10/1958 | Barlow et al | 330/185 X |
| 3,346,697 | 10/1967 | Kitsopoulos | 179/15 |

*Primary Examiner*—Nathan Kaufman
*Attorney*—Francis L. Masselle and William Grobman

[57] ABSTRACT

A digitally controlled filter comprises an operational amplifier having selectable output circuits with predetermined time constants. A plug-in unit determines whether the filter will be a high-pass filter, a low-pass filter, or a band-pass filter. The time constants in the circuit are determined by the application of a digital word to a plurality of switching gates to connect into the circuit one or more impedance combinations having predetermined time constants.

9 Claims, 11 Drawing Figures

INVENTOR.
HAROLD H. HENEGAR
BY
William Grobman

INVENTOR.
HAROLD H. HENEGAR
BY William Grobman

INVENTOR.
HAROLD H. HENEGAR
BY
William Grobman

*INVENTOR.*

HAROLD H. HENEGAR

BY

*William Grobman*

DIGITALLY CONTROLLED FREQUENCY FILTER

This invention relates to frequency filters, and more particularly to a versatile arrangement which selectively can form a high-pass, a low-pass, or a band-pass filter whose filtering range is determined by the application of a digital word.

From the early days of telephony, filters have played an important part in communication. As radio broadcasting became increasingly important, so did filtering circuits become increasingly important. During the earily periods of radio and telephone communications, filters were generally designed for a specific purpose and range of frequency. Often they were cumbersome and bulky and not readily modified. Most early filters were passive. A passive filter is one which contributes nothing to the circuit, but merely attenuates unwanted frequencies. An active filter is one which contains components which are automatically variable to contribute generating operating conditions to a circuit. As active filters have improved in their stability and operation, they have come more common and more variable. Variable filters have been important to the radio industry for 50 years, but these filters, are suitable in those situations where changes in tuning or other changed conditions occur slowly. However, as more devices, processes, and equipment come under computer control, the speed of response of such devices must increase. Computer controlled filters are one type of those devices.

It is an object of this invention to provide a new and improved active circuit component.

It is another object of this invention to provide a new and improved variable filter.

It is a further object of this invention to provide a new and improved automatically variable filter with high speeds of response.

It is still another object of this invention to provide a new and improved active filter which is controllable by computer means.

It is still a further object of this invention to provide a new and improved active filter system which is easily and readily modified to change its filtering characteristics.

Other objects and advantages of this invention will become more apparent as the following description proceeds, which description should be considered together with the accompanying drawings, in which:

FIGS. 1, 2, 3, and 4 are schematic block diagrams of typical active low- and high-pass filters;

Figure 1:
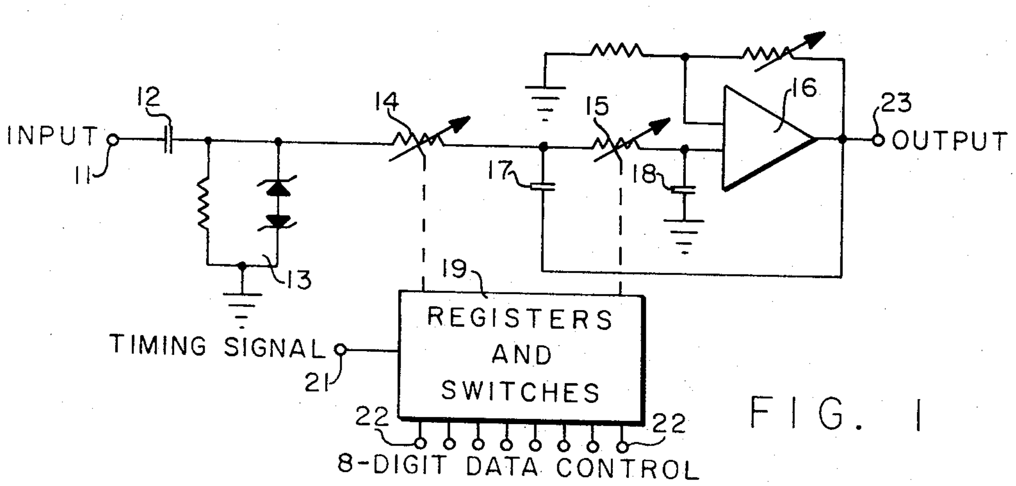

Referring now to the drawings in detail, and more particularly to FIG. 1, reference character 11 designates an input terminal which is connected through a capacitor 12 and across a high voltage protection network 13 to one side of a variable resistor 14. The other side of the variable resistor 14 is connected to one side of a second variable resistor 15, the other side of which is connected to the input of an amplifier 16. The output from the amplifier 16 is connected both to an output terminal 23 and through a capacitor 17 to the junction of the two variable resistors 14 and 15. A capacitor 18 is connected between the input of the amplifier 16 and ground. The variable resistors 14 and 15 are coupled to a block 19 which contains a register and appropriate input switches. A timing signal is applied to the block 19 through an input terminal 21, and a digital control word is applied to the block 19 through appropriate input terminals 22.

The circuit shown in FIG. 1 is a low-pass second-order filter which is controllable by means of a computer input word. An input signal is applied to the terminal 11. This signal is an oscillating signal of any suitable frequency or frequencies. The signal applied to the input terminal 11 may be composed of a group of signals of relative fixed frequencies and constant amplitudes or it may be a composed signal formed of changing frequencies whose amplitudes are also variable. The signal is coupled to the amplifier 16 through the capacitor 12 and the two variable resistors 14 and 15, which are connected in series. The resistor 14, together with the capacitor 17, forms one time constant circuit, and the resistor 15, together with the capacitor 18, forms a second time constant circuit. The time constants of these two circuits are varied by changing the resistance values of the two variable resistors 14 and 15. The lower frequencies of the input signal applied to the terminal 11 tend to pass through the resistors 14 and 15 and the amplifier 16 to the output terminal 23. The higher frequency signals, however, are bypassed by the capacitor 18 to ground. Which signals pass through the resistors 14 and 15 will determine which signals appear at the output terminal 23. The higher the time constant of the resistor 15–capacitor 18 combination, the lower the frequencies which will be applied to the input of the amplifier 16. Actually, as the value of the resistor 15 is changed to increase the time constant, the relative impedance that the capacitor 18 presents to lower frequency signals will gradually drop. This means that the higher frequency signals will be short-circuited by the capacitor 18, and, as the frequency of the signal presented to the amplifier 16 decreases, the amplitude of these signals to the input of the amplifier 16 will increase. The combination of capacitor 17 and resistor 14 forms a high-pass filter with the capacitor 17 connected in a feedback path from the output of the amplifier 16. The higher frequencies which are passed through the amplifier 16 and appear at its output are fed back through the capacitor 17 to the junction of the resistors 14 and 15 in phase-opposition to the signals which are presented there. This serves, further, to cancel the higher frequency signals, providing a sharper rolloff of the filter itself. The adjustments of the resistors 14 and 15 to determine their instantaneous values are accomplished by the contents of the block 19. Block 19 comprises a register which stores the eight-digit word applied to the input terminals 22 from a computer or other source, and a bank of switches which are controlled by the contents of the register. The timing signal 21 serves to transfer information from the register at the appropriate time.

Figure 2:
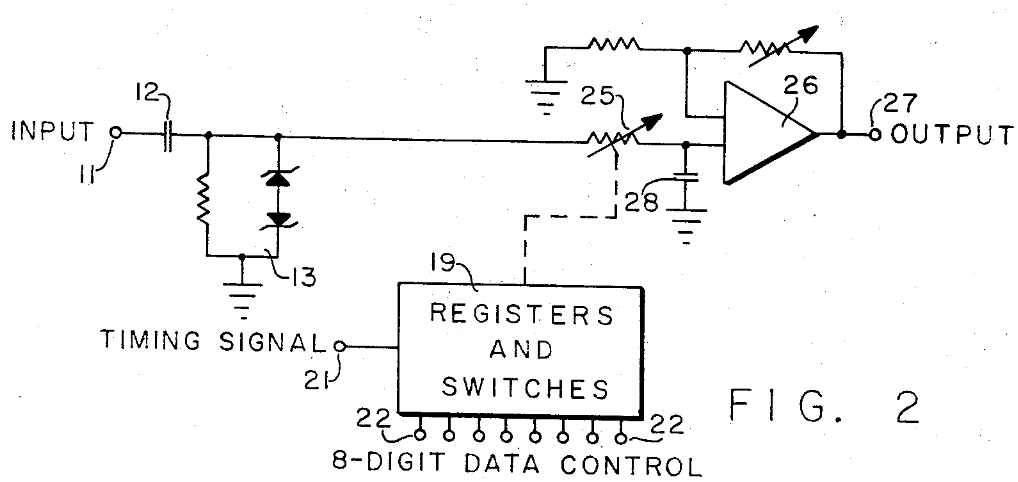

FIG. 2 shows a first-order low-pass filter which is very similar to the device of FIG. 1. An input terminal 11 is connected through a capacitor 12 and across a voltage protection circuit 13 to one side of a variable resistor 25. The other side of the resistor 25 is connected across a capacitor 28 to the input of an amplifier 26, whose output is connected to a terminal 27. A block 19, similar to that of FIG. 1, contains switches and registers and is connected to a timing circuit terminal 21 and to a bank of digit input terminals 22. The operation of the first-order low-pass filter of FIG. 2 is the same as the operation of the second-order low-pass filter of FIG. 1, except that a single time-constant circuit comprising variable resistor 25 and capacitor 28 is used. As described in connection with FIG. 1, the input signal applied to the terminal 11 passes through the capcitor 12 and the resistor 25 to the input of the amplifier 26. The time constant of the resistor 25 and capacitor 28 determines which frequencies will be substantially short-circuited to ground by the capacitor 28 and which frequencies will be applied to the input of the amplifier 26. The higher frequency signals will, of course, pass through capacitor 28 to ground. Since there is no feedback path to further cancel the higher frequency signals applied to the input of the amplifier 26, the rolloff slope of the filter in FIG. 2 is not as steep as that of FIG. 1. The digital word applied to the input terminals 22 is transferred from the register in the block 19 by the application of the timing signal of the terminal 21. The contents of the register in the block 19 determines the settings of the switches in the block 19, and they, in turn, determine the value of the resistor 25, the time constant of the filter, and the frequencies which are passed by the filter.

Figure 3:
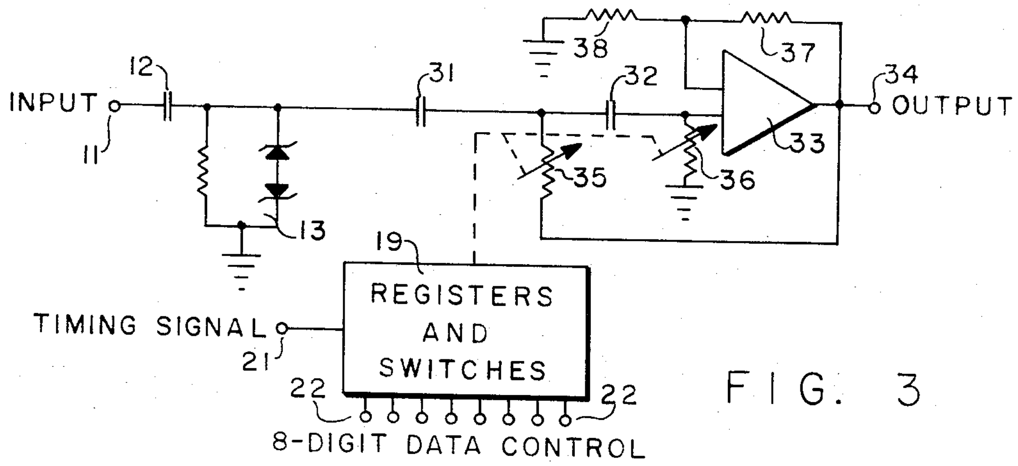
Figure 4:
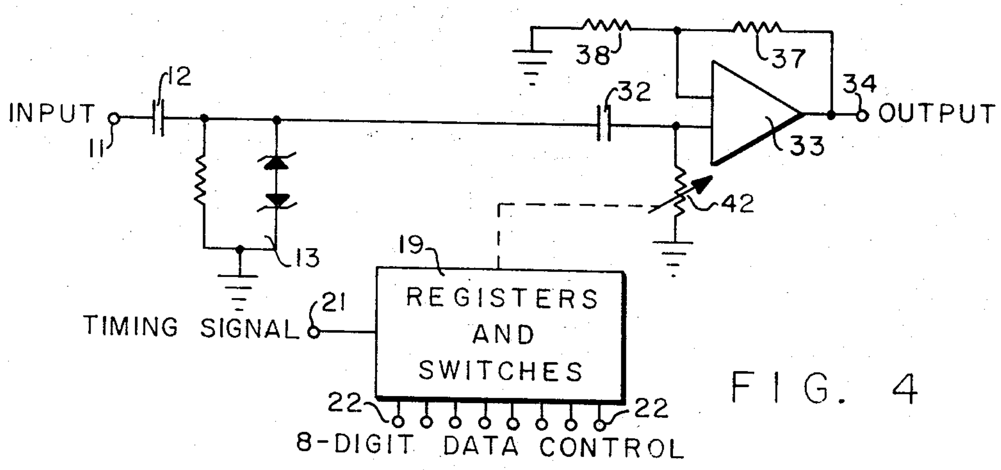

FIG. 3 shows a second-order high-pass filter, and FIG. 4 shows a first-order high-pass filter, both of which use the same general principles as those in FIGS. 1 and 2. In FIG. 3, a composite alternating signal comprised of a multiplicity of frequencies is applied to an input terminal 11. The signal is transmitted from the input terminal 11 through a capacitor 12 and across a protection circuit 13 to the input capacitor 31 of a capacitor input filter. The signal passes from the capacitor 31 through a capacitor 32 and across a variable resistor 36 which has one end connected to ground and to the input of an amplifier 33. The amplifier 33 is biased by means of a resistor 37 in a feedback path which also includes a resistor 38 connected to ground. The output of the amplifier 33 is applied to an output terminal 34 and through a variable resistor 35 to the junction of the two capacitors 31 and 32. The capacitor 32 and the resistor 36 comprise a time-constant circuit in the input of the amplifier 33 which controls the amplitudes of the various frequencies applied to the input of the amplifier. The higher frequencies readily pass through the capacitor 32 and the lower frequencies tend to be shorted to ground by the variable resistor 36. The signals which pass through the amplifier 33 are inverted thereby, and some of those inverted signals are fed back through the variable resistor 35 to the two capacitors 31 and 32. Since the lower frequencies are readily passed through the variable resistor 35, it is the lower frequencies which cancel out at the capacitors 31 and 32. This circuit provides an effective, active, high-pass filter. The values of the two variable resistors 35 and 36 are controlled by the block 19. As in the circuits in FIGS. 1 and 2, the block 19 contains a register to which digital information is applied by means of input terminals 22, an input timing terminal 21, and a series of switches whose operations depend upon the information contained in the register in the block 19. It is the settings of the switches in the block 19 which control the values of the variable resistors 35 and 36. The first-order high-pass filter shown in FIG. 4 is virtually identical with the filter in FIG. 3, except that the capacitor 31 and the variable resistor 35 in the feedback path of the variable amplifier 33 have been omitted. The operation of the circuit of FIG. 4 has been explained in detail in connection with the description of the circuit if FIG. 3.

Figure 5:
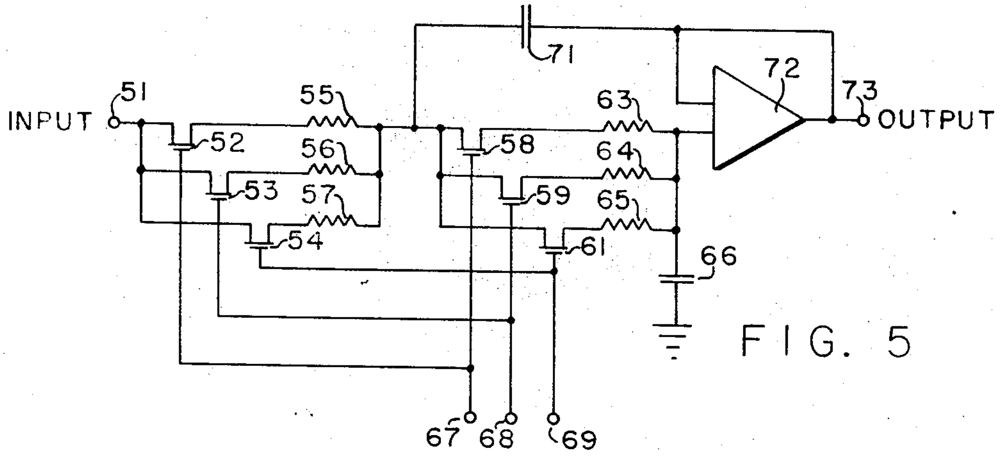
FIG. 5 is a schematic circuit diagram of a typical versatile active filter according to this invention.

The circuits shown in FIGS. 1–4 are merely exemplary and show typical high- and low-pass filters in a simple block and schematic form for explanatory purposes. In an actual embodiment, however, the circuitry may differ somewhat of that of FIGS. 1–4. FIG. 5, for example, shows in simple schematic form one actual configuration of a second-order low-pass filter. An input signal 51 is connected to one side of electronic switches 52, 53, and 54. The other side of switch 52 is connected to one side of a resistor 55; the other side of the switch 53 is connected to one side of a resistor 56; and the other side of the switch 54 is connected to one side of a resistor 57. The other sides of the resistors 55, 56, and 57 are connected together and to one side of electronic switches 58, 59, and 61. The other side of switch 58 is connected to one of the resistors 63; the other side of switch 59 is connected to one of the resistors 64; and the other side of switch 61 is connected to one of the resistors 65. The other sides of the resistors 63, 64, and 65 are connected together and to the input of an amplifier 72. The input to the amplifier 72 is connected through a capacitor 66 to ground. The output of the amplifier 72 is connected to an output terminal 73 and through a capacitor 71 back to the junction between the resistors 55–57 and the switches 58–61. Input terminals 67, 68, and 69 are provided to receive digital information from a suitable source. The control electrodes of switches 52 and 58 are connected to terminal 67; the control electrodes of switches 53 and 59 are connected to input terminal 68; and the control electrodes of switches 54 and 61 are connected to input terminal 69.

The operation of the filter is essentially the same as the operation of the filters shown in FIG. 1. An oscillatory signal made up of a large number of various frequencies is applied to the input terminal 51, and a digital word of three digits for the circuit FIG. 5, which word represents the frequency range of the filter, is applied to the input terminals 67, 68, and 69. It is realized that FIG. 5 does not include a register, whereas the circuits shown in FIGS. 1–4 do. It is assumed that the information applied to the terminals 67–69 is contained in a register of some sort. If not, one can be provided. The digital information applied to the terminals 67–69 control the conduction of the switches 52–54 and 58–61. Assume, for this discussion, that a zero is applied to terminal 67, a one is applied to terminal 68, and a zero is applied to terminal 69. Under those conditions, the switches 53 and 59 would be conductive, while the other switches would be nonconductive. Under these conditions, the signals applied to the input terminal 51 pass through the switch 53, the resistor 56, the switch 59, and the resistor 64 to the input of the amplifier 72. Under the assumed conditions, one time-constant circuit is formed by the combination of resistor 64 and capacitor 66, and a second time-constant circuit is formed by the combination of resistor 55 and capacitor 71. The capacitor 66 tends to short-circuit to ground the higher frequencies which are applied to theinput 51. For the lower frequency signals, the capacitor 66 seems to be a higher impedance, and those signals are amplified by the amplifier 72. The signals passing through the amplifier 72 are inverted thereby, and the higher frequency signals appearing at the output of the amplifier 72 are fed back through the capacitor 71 and tend to cancel the signals of the same frequency applied from the input terminal 51. In this respect, the circuit of FIG. 5 operates similary to that of the circuit in FIG. 1. It should be pointed out however, that the resistors 55, 56, and 57 correspond to the variable resistor 14 of the system of FIG. 1, and the resistors 63, 64, and 65 correspond to the variable resistor 15 of the system of FIG. 1. In the circuit of FIG. 5, three switches and three resistors in each variable resistor are used. This arrangement requires a digital word of three digits which is applied to the input terminals 67, 68, and 69. It is understood, of course, that any number of switch-resistor combinations may be used to achieve the desired resolution, if a corresponding number of digits in the digital control word is also used.

Figure 6:
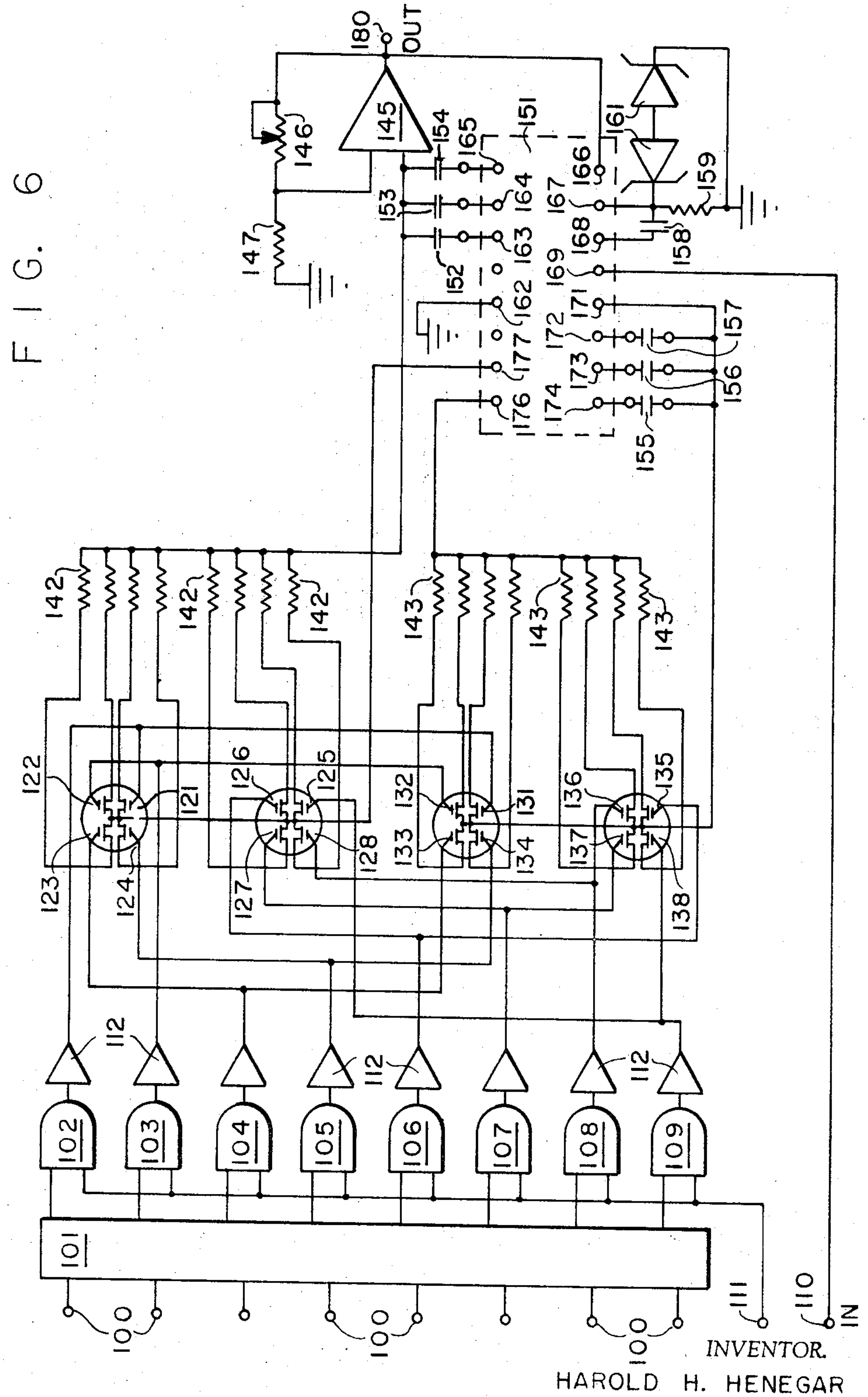
FIG. 6 is a detailed schematic circuit diagram of a computer-controlled filter system according to this invention.

FIG. 6 shows a complete schematic diagram of a variety of filter systems according to the principles of this invention. Terminals 100 are digital input terminals to which the separate digits of the filter control word are applied. Terminals 100 are connected to the inputs of register 101. The register 101 is shown as a single block for simplicity, but it could readily comprise a plurality of flip-flops orother bistable devices. The register 101, in the example of FIG. 6, is designed to store eight digits. The outputs from each of the individual digit storage devices is connected to the input of one gate of a bank of gates 102, 103, 104, 105, 106, 107, 108, and 109. The outputs from the individual gates 102–109 are applied through inverter amplifier circuits 112 to the control electrodes of electronic switches 121, 122, 123, 124, 125, 126, 127, and 128, and 131, 132, 133, 134, 135, 136, 137, and 138. The output from the gate 102 is connected to the control electrodes of switches 121 and 131. The output from the gate 103 is connected to the control electrodes of switches 122 and 132. The output from the gate 104 is connected to the control electrodes of switches 123 and 133. The output from the gate 105 is connected to the control electrodes of switches 124 and 134. The output from the gate 106 is connected to the control electrodes of switches 126 and 135. The output from the gate 107 is connected to the control electrodes of switches 127 and 137. The output from the gate 108 is connected to the control electrodes of switches 128 and 136. The output from the gate 109 is connected to the control electrodes of switches 125 and 138. Two banks of resistors 142 and 143 are shown. All of the resistors of the bank 142 have one side connected together and connected to one side of capacitors 152, 153, and 154, and to the input of the amplifier 145. All of the resistors of the bank 143 have one side connected together and to terminal 176 contained in a terminal block 151. Each of the switches 121-128 has one side connected to the other side of one of the resistors in the bank 142, and each of the switches 135–138 has one side connected to the other side of one of the resistors in the bank 143. The other sides of all of the switches 121–128 are connected togehter and to a terminal 177 on the terminal block 151. Similarly, the other sides of the switches 131–138 are connected together and to one side of each of capacitors 155, 156, and 157, and to a terminal 171 on the terminal block 151. The other side of capacitor 152 is connected to terminal 165, the other side of capacitor 153 is connected to terminal 164, the other side of capacitor 154 is connected to terminal 163, the other side of capacitor 155 is connected to terminal 174, the other side of capacitor 156 is connected to terminal 173, and the other side of capacitor 157 is connected to terminal 172, all of which terminals are on the terminal block 151. An input terminal 110 is adapted to receive a multiplicity of input frequencies and is connected to terminal 169 on the terminal block 151. Additionally, terminal 162 on the block 151 is connected to ground, terminal 168 on the block 151 is connected to one side of the capacitor 158, and terminal 167 is connected to the other side of capacitor 158 and to one side of a protective circuit comprising zener diodes 161 and resistor 159. A biasing circuit comprising a resistor 147, which has one side grounded and the other side connected to another input to the amplifier 145 and the variable resistor 146, is connected in a feedback path between the output of the amplifier 145 and its other input. The output of the amplifier 145 is connected to an output terminal 180.

The circuit shown in FIG. 6 contains all of the ingredients necessary to form any and all of the filters shown in FIGS. 1–5, except for connections among the terminals on the terminal block 151. By appropriate connection among the terminals on the block 151, any of the filter circuits shown in FIGS. 1–4 may be achieved. Before describing the operation of FIG. 6, reference is made to FIG. 7 and FIGS. 8A–8D.

Figure 7:
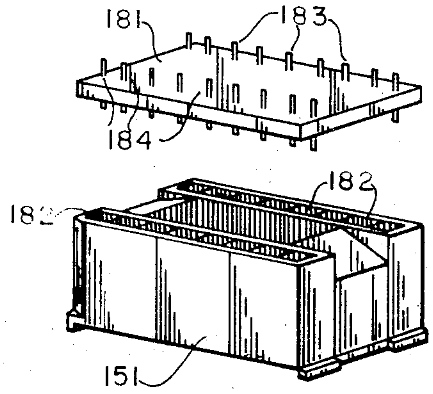
FIG. 7 is an exploded view of a changeable filter component for use in the system of FIG. 6.

FIG. 7 shows one form of a terminal block 151. The block 151 comprises just that—a block of electrically insulating material having a plurality of perforations 182 contained therein. Electrical receptacles or jacks are mounted in each of the perforations 182. In normal fashion, each of the receptacles or jacks contained in the perforations 182 is attached to a wire or lead. These connections are made perferrably from below, as blcok 151 is shown in FIG. 7. A removeable cover comprising a slab 181 of electrically insulating material is formed to fit the top of the block 151. A plurality of conductive pins 183 and 184 is mounted in the slab 181 and passes therethrough. The pins 183 and 184 are so positioned that when the slab 181 is placed over the block 151, each of the pins 183 and 184 electrically engages the receptacles or jacks contained in one of the perforations 182. The portions of the pins 183 and 184 which protrude above the slab 181 are used for making electrical connections thereto. Since the slabs 181 are removeable from the block 151, a single system could be provided with a plurality of slabs 181, each of which contains different wiring connections. By this means, the versatile circuit shown in FIG. 6 can be readily converted from a first-order low-pass filter to a second-order high-pass filter, for example, merely by changing the slab 181 on the block 151. Four wiring configurations for accomplishing this are shown in FIGS. 8A–8D. These will be described together with the explanation of the operation of the circuit of FIG. 6.

Figure 8A:
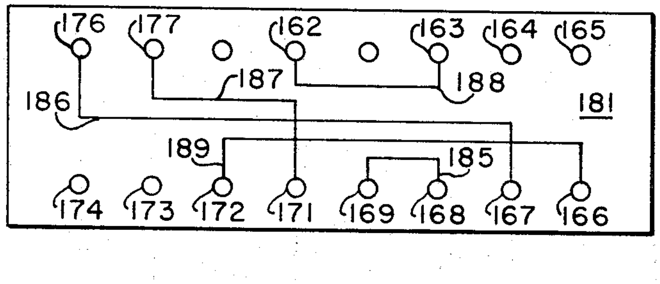
FIGS. 8A–8D are schematic diagrams showing the different types of replaceable elements for the components of FIG. 7.

Referring again to FIG. 6, assume that the slab 181, shown in FIG. 8A, is used together with the block 151. In FIG. 6, the input signal arrives at the input terminal 110 and is applied to block terminal 169. With the slab 181 shown in FIG. 8A, the terminal 169 is connected to the terminal 168, and this applies the input signal to one side of the capacitor 158. The other side of the capacitor 158 is separated from ground by the protection network included in resistor 159 and diode 161, and is connected to terminal 167 on block 151. The terminal 167 is connected to the terminal 176, which applies the signal passing through the capacitor 158 to one side of the resistor bank 143. Which resistors in the bank 143 are connected into the circuit depends upon which of the switches 131–138 are rendered conductive. It is the application of the digital information to input terminals 100 which determines the conductive switches. Digital information applied to the input terminals 100 is transferred into the register 101. When a timing signal is applied to the input terminal 111, it supplies a signal to one input of all of the gates 102–109. Which of the gates 102–109 are opened to pass a signal through the inverter 112 to the appropriate switches is determined by which digit positions in the register 101 contain ones. Those gates 102–109 which have signals on both their inputs are opened, and those gates which do not are closed. When a signal passes through the inverter amplifier 112 to the control electrode of one of the switches 121–128 and 131–138, that switch becomes conductive. Considering, for example, the bank of resistors 142; when a switch 121–128 becomes conductive, it provides a connection from the terminal 177 on the block 151 through that particular resistor to the input of the amplifier 145. Similarly, when one of the switches 131–138 becomes conductive, it provides a direct connection from the terminal 171 on the block 151 through that particular resistor 143 to the terminal 176 on the block 151. When a number of switches are rendered conductive at the same time, the resultant resistance in the circuit depends upon not only how many switches become conductive at any time, but also which ones of the switches are conductive. Returning now to our consideration of the connections, the terminal 167 is connected to the terminal 176 which applies the input signal, having passed through the capacitor 158, to one side of the resistors 143. As described above, the other side of the resistors 143 are individually connected to one side of the switches 131–138, and the other side of the switches 131–138 are connected to the terminal 171 on the block 151. As shown in FIG. 8A, the terminal 171 is connected to the terminal 177, which applies a signal which has passed through the selected resistors 143 to one side of the switches 121–128 and through the selected resistors 142 to the input of the amplifier 145. The output of the amplifier 145 is connected to the terminal 166, which is shown in FIG. 8A to be connected to the terminal 172. This places capacitor 157 in the feedback path of the amplifier 145. In addition, terminal 163 is connected to terminal 162, and this connects capacitor 154 between the input of the amplifier 145 and ground. Thus, when the slab 181, having the wiring configuration shown in FIG. 8A is applied to the top of the block 151, the circuit arrangement is the same as that of FIG. 1—a second-order low-pass filter.

Two means are shown for determining the pass point—the rolloff point—of the filter. The first means helps determine the broad range of operation of the filter and this is provided in the circuit of FIG. 6 by utilizing a plurality of capactors 152–157. These may be connected into the circuit individually or in pluralities by appropriate wiring on the slab 181. Thus, for each second-order low-pass filter of the type shown in FIG. 1, there are several wiring configurations for the slab 181, which can be provided to accommodate several ranges of frequencies. Once the broad range of frequency has been determined and the type of filter has been elected by the appropriately wired slab 181, which is used as a cover for the block 151, closer frequency control of the filter is accomplished by the application of the various digital words to the input terminals 100. It is the combination of ones and zeros in the word applied to the input terminals 100 which determines which of the switches 121–128 and 131–138 will be closed, and, thereby, selecting which resistors 142 and 143, and in what combinations, are connected into the filter to determine the frequency responses of the filter.

Figure 8B:
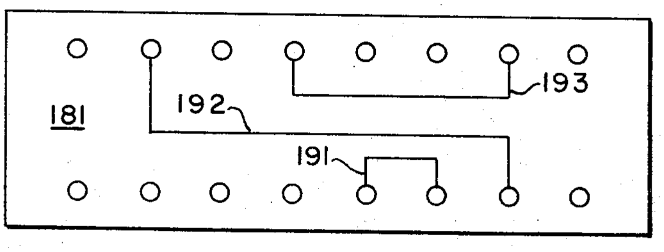
Figure 8C:
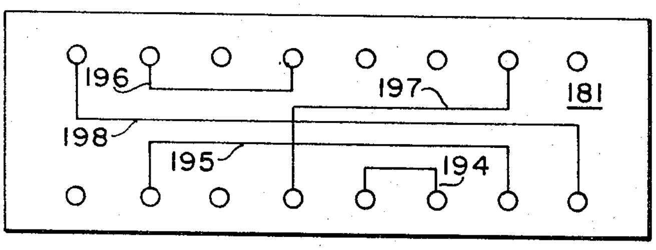
Figure 8D:
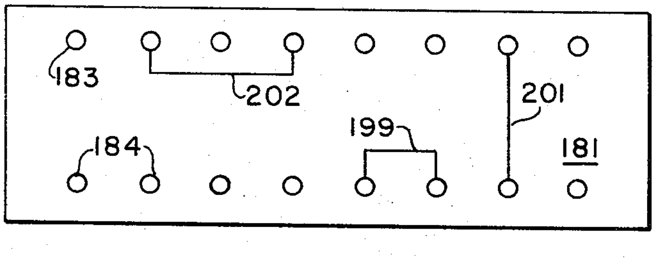

The wiring configuration of the slab 181 shown in FIG. 8B, when combined with the block 151 will produce a first-order low-pass filter having the same circuit shown in FIG. 1. The slab 181 wired as shown in FIG. 8C, when used with the block 151 in the system of FIG. 6, will produce a second-order high-pass filter similar to that shown in FIG. 3. In the same manner, the slab 181 shown as wired in FIG. 8D and used in conjunction with the block 151 of the system of FIG. 6, will produce a first-order high-pass filter shown in FIG. 4. The comments made in connection with the description of the circuitry shown in FIG. 8A and pertaining to the selection of the appropriate capacitors 152–157 also applies to the circuits shown in FIGS. 8B, 8C, and 8D.

This application has described a new and improved filter system which is versatile, effective, and readily variable in both configuration and frequency characteristics. The filter described above readily can be constructed on a single printed circuit card which can, thereafter, be used with appropriate blocks in units to form selected high- or low-pass filters. The filter constructed according to this invention has frequency characteristics which are controllable and determinable by digital data orginating in a computer or other data device.

It is realized that the above description may indicate to those skilled in the art additional ways in which the principles of the invention may be used without departing from its spirit. It is, therefore, intended that this invention be limited only by the scope of the appended claims.

What is claimed is:

1. A selective digitally controlled frequency filter comprising:

a. a base;

b. a plurality of first type of impedances mounted on said base;

c. a plurality of second type of impedances mounted on said base, each combination of a first type of impedances and a second type of impedances forming a filter component;

d. a plurality of supports each of which carries a different arrangement of electrical conductors, said supports individually mating with said base;

e. first means carried on said base and second means carried on said individual supports for electrically connecting at least one side of said first type of impedances and of said second type of impedances to said electrical conductors so that when a support is mated with said base said first impedances are connected on one side to selected ones of said second impedance in a prescribed pattern to form a prescribed type of filter;

f. a plurality of electrical switches which respond to an electrical digital representation of a quantity to open and close;

g. means for connecting one side of said individual electrical switches to the other sides of said individual first impedances and the other sides of said switches together and to a common reference potential; and h. means for connecting the other sides of said second impedances to said common reference potential;

i. whereby a particular support mated with said base connects togehter said first and second impedances to form a prescribed type of filter and an electrical digital representation of a quantity applied to said switches connect together individual first impedances to select the range of said filter.

2. The filter defined in claim 1 wherein said base comprises an electrical socket and wherein said supports comprise electrical plugin units.

3. The filter defined in claim 1 further including means for receiving digital information and for storing said digital information, and means for connecting the output of said storing means to said switch means.

4. The filter defined in claim 3 further including means interposed between said storing means and said switch means for controlling the transfer of digital data therebetween.

5. The filter defined in claim 4 wherein said second elements comprise capacitors and said first elements comprise resistors.

6. The filter defined in claim 2 wherein said second elements comprise capacitors and said first elements comprise resistors.

7. The filter defined in claim 6 wherein said individual resistors have one end connected to one side of said individual switch means, and wherein said plurality of switches has its other ends connected together and to said socket.

8. The filter defined in claim 7 further including an operational amplifier, means connecting an input of said amplifier to said socket, and means for connecting the output of said amplifier to the output of said socket so that said socket connects said amplifier into said filter selectively to form first and higher order filters.

9. The filter defined in claim 8 wherein at least some of said switches have their other ends connected to said input of said amplifier, and wherein at least one of said capacitors connects said input to said socket.

* * * * *